(12) United States Patent
Guzman-Casillas et al.

(10) Patent No.: US 10,585,133 B2
(45) Date of Patent: Mar. 10, 2020

(54) ELECTRIC POWER FAULT PROTECTION DEVICE USING SINGLE-ENDED TRAVELING WAVE FAULT LOCATION ESTIMATION

(71) Applicant: Schweitzer Engineering Laboratories, Inc., Pullman, WA (US)

(72) Inventors: Armando Guzman-Casillas, Pullman, WA (US); Yajian Tong, Pullman, WA (US); Mangapathirao Venkata Mynam, Pullman, WA (US); Bogdan Z. Kasztenny, Markham (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 6 days.

(21) Appl. No.: 16/358,407

(22) Filed: Mar. 19, 2019

(65) Prior Publication Data
US 2019/0212382 A1 Jul. 11, 2019

Related U.S. Application Data

(63) Continuation-in-part of application No. 15/884,707, filed on Jan. 31, 2018, now Pat. No. 10,302,690, (Continued)

(51) Int. Cl.
*G01R 31/08* (2006.01)
*G01R 31/11* (2006.01)

(52) U.S. Cl.
CPC ............ *G01R 31/085* (2013.01); *G01R 31/11* (2013.01)

(58) Field of Classification Search
CPC .............. G01R 31/02; G01R 31/08–11; G01R 31/2836–2849; G01R 31/40
See application file for complete search history.

(56) References Cited

U.S. PATENT DOCUMENTS

| 3,585,298 A | 6/1971 | Liberman |
| 3,670,240 A | 6/1972 | Maranchak |

(Continued)

FOREIGN PATENT DOCUMENTS

| EP | 226210 | 12/1986 |
| EP | 241832 | 7/1990 |

(Continued)

OTHER PUBLICATIONS

Harshad Mehta, Fault Location Techniques for High-Voltage DC Lines, EPRI EL-4331 Project 2150-1, 1985.

(Continued)

*Primary Examiner* — Huy Q Phan
*Assistant Examiner* — David B Frederiksen
(74) *Attorney, Agent, or Firm* — Richard M. Edge

(57) ABSTRACT

A single-ended traveling wave fault location estimation is calculated using this disclosure, and a confidence level is determined based on available independent fault location estimations. Hypothesis are calculated based on traveling wave times and values, wherein the values indicate a polarity that is the same as the first received traveling wave. Hypothesis are then compared against results of other fault location estimations, and confidence levels assigned accordingly. The fault location is then calculated and displayed based on the hypothesis and confidence levels.

20 Claims, 7 Drawing Sheets

Related U.S. Application Data which is a continuation of application No. 15/806,959, filed on Nov. 8, 2017, now Pat. No. 10,295,585.

(60) Provisional application No. 62/645,675, filed on Mar. 20, 2018, provisional application No. 62/420,977, filed on Nov. 11, 2016.

(56) References Cited

U.S. PATENT DOCUMENTS

| | | | |
|---|---|---|---|
| 3,878,460 A | 4/1975 | Nimmersjö | |
| 3,890,544 A | 6/1975 | Chamia | |
| 3,956,671 A | 5/1976 | Nimmersjö | |
| 4,053,816 A | 10/1977 | Nimmersjö | |
| 4,254,444 A | 3/1981 | Eriksson | |
| 4,296,452 A | 10/1981 | Eriksson | |
| 4,344,142 A | 8/1982 | Diehr | |
| 4,351,011 A | 9/1982 | Liberman | |
| 4,377,834 A | 3/1983 | Eriksson | |
| 4,499,417 A | 2/1985 | Wright | |
| 4,626,772 A | 12/1986 | Michel | |
| 4,766,549 A | 8/1988 | Schweitzer | |
| 4,797,805 A | 1/1989 | Nimmersjö | |
| 4,800,509 A | 1/1989 | Nimmersjö | |
| 5,198,746 A | 3/1993 | Gyugyi | |
| 5,272,439 A * | 12/1993 | Mashikian | G01R 31/1272 324/520 |
| 5,446,387 A | 8/1995 | Eriksson | |
| 5,572,138 A | 11/1996 | Nimmersjö | |
| 5,600,248 A * | 2/1997 | Westrom | G01R 31/088 324/522 |
| 5,682,100 A | 10/1997 | Rossi | |
| 5,729,144 A | 3/1998 | Cummins | |
| 6,161,077 A * | 12/2000 | Fawcett | G01R 31/083 324/523 |
| 6,341,055 B1 | 1/2002 | Guzman-Casillas | |
| 6,417,791 B1 | 7/2002 | Benmouyal | |
| 6,477,475 B1 | 11/2002 | Takaoka | |
| 6,597,180 B1 | 7/2003 | Takaoka | |
| 6,798,211 B1 | 9/2004 | Rockwell | |
| 7,174,261 B2 | 2/2007 | Gunn | |
| 7,535,233 B2 | 5/2009 | Kojovic | |
| 7,714,735 B2 | 5/2010 | Rockwell | |
| 7,733,094 B2 | 6/2010 | Bright | |
| 8,315,827 B2 | 11/2012 | Faybisovich | |
| 8,525,522 B2 | 9/2013 | Gong | |
| 8,598,887 B2 | 12/2013 | Bjorklund | |
| 8,655,609 B2 | 2/2014 | Schweitzer | |
| 8,781,766 B2 | 7/2014 | Schweitzer | |
| 8,874,391 B2 * | 10/2014 | Taylor | G01R 27/04 324/522 |
| 8,990,036 B1 | 3/2015 | Schweitzer | |
| 9,470,748 B2 | 10/2016 | Schweitzer | |
| 9,594,112 B2 | 3/2017 | Schweitzer | |
| 9,627,881 B2 | 4/2017 | Schweitzer | |
| 10,090,664 B2 | 10/2018 | Schweitzer | |
| 10,295,585 B2 | 5/2019 | Schweitzer | |
| 10,302,690 B2 | 5/2019 | Schweitzer | |
| 10,310,004 B2 | 6/2019 | Schweitzer | |
| 10,310,005 B2 | 6/2019 | Schweitzer | |
| 2001/0012984 A1 | 8/2001 | Adamiak | |
| 2002/0118021 A1 * | 8/2002 | Saha | G01R 31/083 324/525 |
| 2002/0130668 A1 * | 9/2002 | Blades | G01R 1/07 324/536 |
| 2002/0165462 A1 | 11/2002 | Westbrook | |
| 2002/0169585 A1 * | 11/2002 | Jones | H04L 43/50 702/189 |
| 2004/0189317 A1 | 9/2004 | Borchert | |
| 2004/0230387 A1 | 11/2004 | Bechhoefer | |
| 2005/0057227 A1 * | 3/2005 | Rockwell | G01R 31/085 323/208 |
| 2005/0151659 A1 | 7/2005 | Donovan | |
| 2006/0012374 A1 | 1/2006 | Kojovic | |
| 2007/0124093 A1 * | 5/2007 | Choi | G01R 31/088 702/59 |
| 2008/0077336 A1 | 3/2008 | Fernandes | |
| 2009/0230974 A1 | 9/2009 | Kojovic | |
| 2011/0058285 A1 | 3/2011 | Wibben | |
| 2011/0173496 A1 | 7/2011 | Hosek | |
| 2011/0227581 A1 | 9/2011 | Kojovic | |
| 2011/0264388 A1 | 10/2011 | Gong | |
| 2012/0086459 A1 | 4/2012 | Kim | |
| 2012/0256637 A1 * | 10/2012 | Juhlin | G01R 31/11 324/523 |
| 2013/0021039 A1 | 1/2013 | Bjorklund | |
| 2013/0096854 A1 | 4/2013 | Schweitzer | |
| 2013/0100564 A1 | 4/2013 | Zhang | |
| 2013/0116944 A1 | 5/2013 | Seibel | |
| 2013/0241622 A1 | 9/2013 | Zerbe | |
| 2014/0074414 A1 | 3/2014 | Schweitzer, III | |
| 2015/0081236 A1 | 3/2015 | Schweitzer | |
| 2016/0077149 A1 | 3/2016 | Schweitzer | |
| 2016/0077150 A1 | 3/2016 | Schweitzer | |
| 2016/0084893 A1 | 3/2016 | Schweitzer | |
| 2016/0266192 A1 | 9/2016 | Burek | |
| 2017/0012424 A1 | 1/2017 | Schweitzer | |
| 2017/0082675 A1 | 3/2017 | Schweizer | |
| 2017/0104324 A1 | 4/2017 | Schweitzer | |
| 2017/0146613 A1 | 5/2017 | Schweitzer | |
| 2018/0292448 A1 | 10/2018 | Schweitzer | |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

Borghetti, et al, "On the use of continuous-wavelet transform for fault location in distribution power systems." International Journal of Electrical Power & Energy Systems. Nov. 2006.

Maher M.I. Hashim, Hew Wooi Ping, V.K. Ramachandaramurthy, Impedance-Based Fault Location Techniques for Transmission Lines, Sep. 2009.

(56) References Cited

OTHER PUBLICATIONS

Zheng et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

Toshio Tahagi, Jun-Ichi Baba, Katauhiko Usmura, Tishiaki Sakaguchi, Fault Protection Based on Travelling Wave Theory—Part I Theory, Jan. 24, 1977.

He, Baina, Yunwei Zhao, and Hengxu Ha. "A Novel Wave Based Differential Protection for Distributed Parameter Line." Telkomnika Indonesian Journal of Electrical Engineering Telkomnika 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

Jaili Ding, Xin Wang, Yihui Zheng, Lixue Li, Distributed Traveling-Wave-Based Fault-Location Algorithm Embedded in Multi-Terminal Transmission Lines, IEEE Transactions on Power Delivery, Jun. 27, 2018.

Edmund O. Schweitzer, III, Bogdan Kasztenny, Distance Protection: Why Have We Started with a Circle, Does it Matter, and What Else is Out There? 44th Annual Western Protective Relay Conference, Oct. 2017.

* cited by examiner

ELECTRIC POWER FAULT PROTECTION DEVICE USING SINGLE-ENDED TRAVELING WAVE FAULT LOCATION ESTIMATION

RELATED APPLICATION

This application claims benefit under 35 U.S.C. § 119(e) to U.S. provisional application Ser. No. 62/645,675 filed on 20 Mar. 2018 titled "Determining a Confidence Level of a Single-Ended Traveling Wave Fault Location Estimation" naming Armando Guzman-Casillas, Bogdan Z. Kasztenny, Mangapathirao Venkata Mynam, and Yajian Tong as inventors; and claims benefit as a Continuation-in-Part of U.S. Non-Provisional application Ser. No. 15/884,707, titled "Traveling Wave Based Single End Fault Location" filed on 31 Jan. 2018, naming Edmund O. Schweitzer III, Armando Guzman-Casillas, Bogdan Z. Kasztenny, Yajian Tong, and Mangapathirao Venkata Mynam as inventors, which claims benefit as a Continuation application of U.S. patent application Ser. No. 15/806,959 filed on 8 Nov. 2017, titled "Traveling Wave Based Single End Fault Location", naming Edmund O. Schweitzer III, Armando Guzman-Casillas, Bogdan Z. Kasztenny, Yajian Tong, and Mangapathirao Venkata Mynam as inventors, which claims priority under 35 U.S.C. § 119(e) to U.S. Provisional Patent Application No. 62/420,977 filed on 11 Nov. 2016 titled "Traveling Wave Based Single End Fault Location" naming Edmund O. Schweitzer III, Armando Guzman-Casillas, Bogdan Z. Kasztenny, Yajian Tong, and Mangapathirao Venkata Mynam as inventors, each of which is incorporated herein by reference in its entirety.

TECHNICAL FIELD

This disclosure relates to an improvement in the calculation of fault locations in an electric power delivery system. More particularly, this disclosure relates to improving fault location calculations using single-ended traveling wave fault location estimation and confidence levels for hypothesized fault locations.

BRIEF DESCRIPTION OF THE DRAWINGS

This disclosure includes illustrative embodiments that are non-limiting and non-exhaustive. Reference is made to certain of such illustrative embodiments that are depicted in the figures described below.

DETAILED DESCRIPTION

Figure 1:
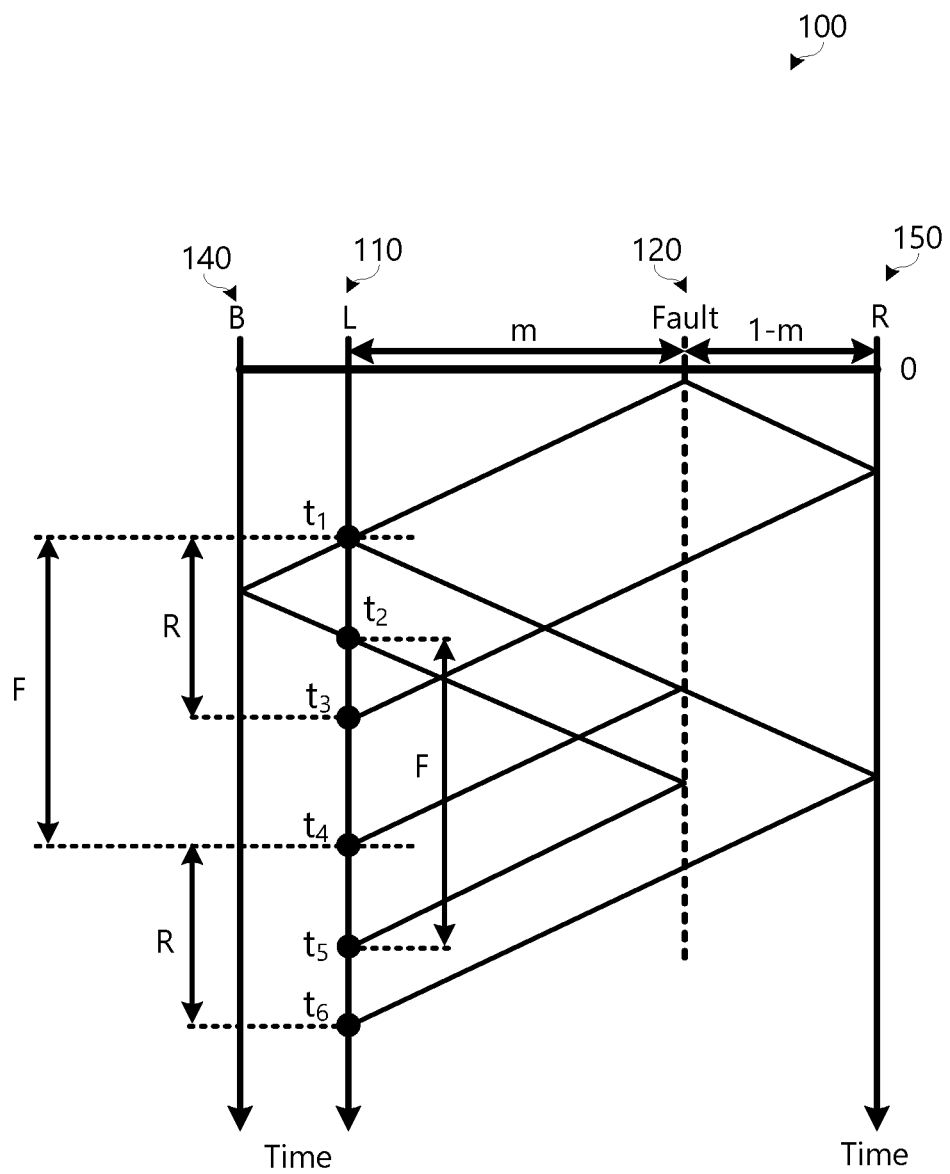
FIG. 1 illustrates an example of a Bewley lattice diagram that includes a substation, local terminal, fault location, and a remote terminal.

The embodiments herein describe improvements to the technology of electric power system fault location calculation. The improvements include determining confidence of fault location hypotheses that are calculated based on measurements taken from a single end of the electric power delivery system. Due to unavailability of measurements or calculations from multiple ends or due to possible errors in multiple-ended measurements, single-ended fault location calculations may be necessary. However, as described in more detail herein, fault location using measurements at a single end may result in multiple fault location results. What is needed is an improvement to determine a confidence of the multiple fault location results such that the most accurate fault location may be determined and reported.

Many of the embodiments described herein may be implemented by one or more intelligent electronic devices (IEDs). As used herein, an IED may refer to any microprocessor-based device that locates faults, monitors, controls, automates, and/or protects monitored equipment within a power system. Such devices may include or be embodied as, for example, line protective relays, feeder relays, bay controllers, meters, and the like. The term IED may be used to describe an individual IED or a system comprising multiple IEDs. An IED may be said to be processor-based, perform calculations, and the like, even though the IED may rely on cloud-based or server-based processing power available via a communication network.

Additional understanding of the embodiments of the present disclosure can be gained by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified or contextually required.

Faults on power systems may be detected and a location thereof calculated using electrical measurements. Fault location methods that use electrical measurements generally include impedance-based and traveling-wave-based methods. Impedance-based methods use fundamental frequency currents and voltages. Traveling-wave-based methods use arrival times of traveling waves in currents, or so-called incident waves, the latter being a combination of voltage and current traveling waves, assuming a high-fidelity voltage signal source is available. In either method, electrical measurements are taken at the line terminals, such as at power substations, where the measurements are readily available, and the fault detection can be integrated with other electric power protection, control, and monitoring. Some fault locators may use measurements from one end of the line (i.e., using a single-ended method), while other fault locators may use measurements from both (or all) ends of the line (i.e., using double-ended or multi-ended methods).

Impedance-based fault locators have limited accuracy. A single-ended fault locator may only be accurate to within a small percentage of the line length. For a long line, such as a 200-kilometer-long line, a ±5 percent error corresponds to a 20-kilometer interval of uncertainty. In an embodiment in which towers are located every 300 meters, an inspection or repair crew may be deployed to search for the fault on a span of more than 66 towers (20 kilometers/300 meters). Double-ended impedance-based fault locators are more accurate. However, even with a ±1 percent error, the margin of error may still correspond to many tower spans. Traveling-wave-based fault locators are much more accurate. Typically, they can locate faults to within one or two tower spans.

Impedance-based fault locating methods typically require the presence of a fault for multiple cycles to provide accurate fault location results. In various systems, such as higher-voltage systems, faults may be cleared in less than two cycles, resulting in lower accuracy for impedance-based fault location calculations. Traveling-wave based fault location calculations, however, may be used to determine fault location with an accuracy of one or two tower spans, and on a much shorter time scale.

Double-ended traveling wave fault location methods (which may be referred to herein as DETWFL) use the first traveling wave arrival times at the local and remote terminals. Together with the parameter of the line length (LL) and traveling wave line propagation time (TWLPT), the fault location may be calculated in accordance with Equation 1:

$$M = \frac{LL}{2}\left(1 + \frac{t_L - t_R}{TWLPT}\right) \quad \text{Eq. 1}$$

where:
$t_L$ is the arrival time of the traveling wave at the local terminal;
$t_R$ is the arrival time of the traveling wave at the remote terminal; and
M denotes the distance to the fault from the local terminal along the transmission line.

Single-ended traveling wave fault location (which may be referred to herein as SETWFL) uses a time difference between the first traveling wave from the fault and the first reflection from the fault measured at a single terminal. FIG. 1 illustrates a one-line diagram of a transmission line 100 exhibiting a fault 120 at position m (in per-unit of the line length) along with a timing diagram showing various traveling wave instances and reflections. Upon occurrence of fault 120, traveling waves are launched toward the local terminal L 110 and the remote terminal R 150. A current traveling wave launched by the fault 120 arrives at the local terminal L 110 at time $t_1$. Part of the traveling wave reflects back toward the fault, reflects back from the fault, and then returns to the local terminal L 110 at time $t_4$. During the time interval $\Delta t = t_4 - t_1$, the traveling wave has traveled a distance of 2*M. The fault location may be calculated in accordance with Equation 2:

$$M = \frac{LL}{2}\left(\frac{\Delta t}{TWLPT}\right) \quad \text{Eq. 2}$$

It should be noted that the term Δt refers to the time difference between the arrival times of a selected pair of traveling waves. Further, note that the distance M from the terminal to the fault may be related to the per-unit distance m from the terminal to the fault m using Equation 3:

$$M = LL * m \quad \text{Eq.3}$$

FIG. 1 may be used to illustrate the complexity of calculating a fault location. Part of the traveling wave launched by the fault 120 toward the local terminal L 110 passes through the local terminal L 110, is reflected from bus B 140, and passes again through local terminal L 110 at time $t_2$. A reflection of a traveling wave from the remote bus R 150 arrives at local terminal L 110 at time $t_3$. Further reflections are detected at local terminal L 110 at times $t_4$, $t_5$, and $t_6$. As is illustrated, it can be quite challenging to find the traveling wave that is the first reflection from the fault among all of the other traveling waves that may arrive at the local terminal, including the traveling waves that arrive from behind the terminal (e.g. from bus B 140) or from a terminal or bus in front of the terminal (e.g. from remote terminal R 150). What is needed is a method to calculate a fault location using information from a single end of the electric power delivery system, even where multiple instances and reflections of traveling waves are detected. Disclosed herein are improvements on fault location calculation using traveling wave information from a local terminal of the electric power delivery system.

As used herein, the term "fault" is generally used. It should be noted, however, that the embodiments herein may be used to detect and calculate a location of any event that launches traveling waves on the electric power delivery system. Such events may include, for example, flashover, discharge, intermittent fault, switching events, and the like. Furthermore, fault detection and location calculations may be performed in a single physical device or across multiple devices. In certain embodiments, a single IED may perform both the fault detection function and the fault location calculations.

The improvements herein use measurements taken from a single end of the electric power delivery system, such as measurements from a single local bus of the electric power delivery system. As illustrated in FIG. 1, certain pairs of traveling wave instances or reflections may be used to calculate a distance from the local terminal L 110 to the fault 120. As illustrated, $t_1$ is the arrival time (i.e., TPK) of the first received traveling wave from the fault at location 120. $t_2$ is the arrival time of a traveling wave from the local bus B 140 behind the local terminal L 110. $t_3$ is the arrival time of a traveling wave that traveled from the fault at location 120 to the remote bus R 150 and was reflected back to the local terminal L 110. $t_4$ is the arrival time of the first traveling wave after having been reflected by the local terminal L 110, back to the fault at location 120, and then back to the local terminal L 110. $t_5$ is related to reflections between the bus 140 and the fault at location 120. Finally, $t_6$ is the arrival time of a traveling wave that traveled from the fault at location 120 to the local terminal L 110, from the local terminal L 110 to the remote bus R 150, and from the remote bus R 150 back to the local terminal L 110.

The arrival times of $t_3$ and $t_4$ may be used with reference to arrival time $t_1$ to determine the relative arrival times (TPKs) to determine a location of the fault from the local terminal L 110 and/or the remote terminal R 150. The distance may be calculated at least in part, on the line length LL. By identifying the origin or reflection path of received traveling waves and/or traveling wave patterns, the system can estimate an accurate distance between the local terminal L 110 and the location of the fault 120.

The fault at location 120 is a distance m from the local terminal 110, so the first traveling wave is received at time $t_1$ that is equal to m*TWLPT. Another traveling wave should return from the remote bus 150 at the time $t_3$ that is equal to (2−m)*TWLPT. The difference between these two times is 2*(1−m)*TWLPT. Thus, one traveling wave arrival time is expected at time $t_1$+2*(1−m)*TWLPT, which is equal to $t_3$. The first reflection from the fault is expected at time $t_4$, which is equal to $t_1$+2*m*TWLPT.

The timing and polarities of the traveling waves that are spaced by 2*m*TWLPT and 2*(1−m)*TWLPT may be evaluated. Each reflection from a discontinuity behind the local terminal 110 (e.g., from substation 140) may generate a traveling wave (a "test traveling wave") toward the fault. Consequently, the system may expect multiple pairs of traveling waves that are spaced by 2*m*TWLPT. Multiple possible traveling wave pairs may be evaluated to identify the distance to the fault, m. The time distance between pairs of traveling waves that occurs most frequently may be determined to be equal to 2*m*TWLPT.

Figure 2:
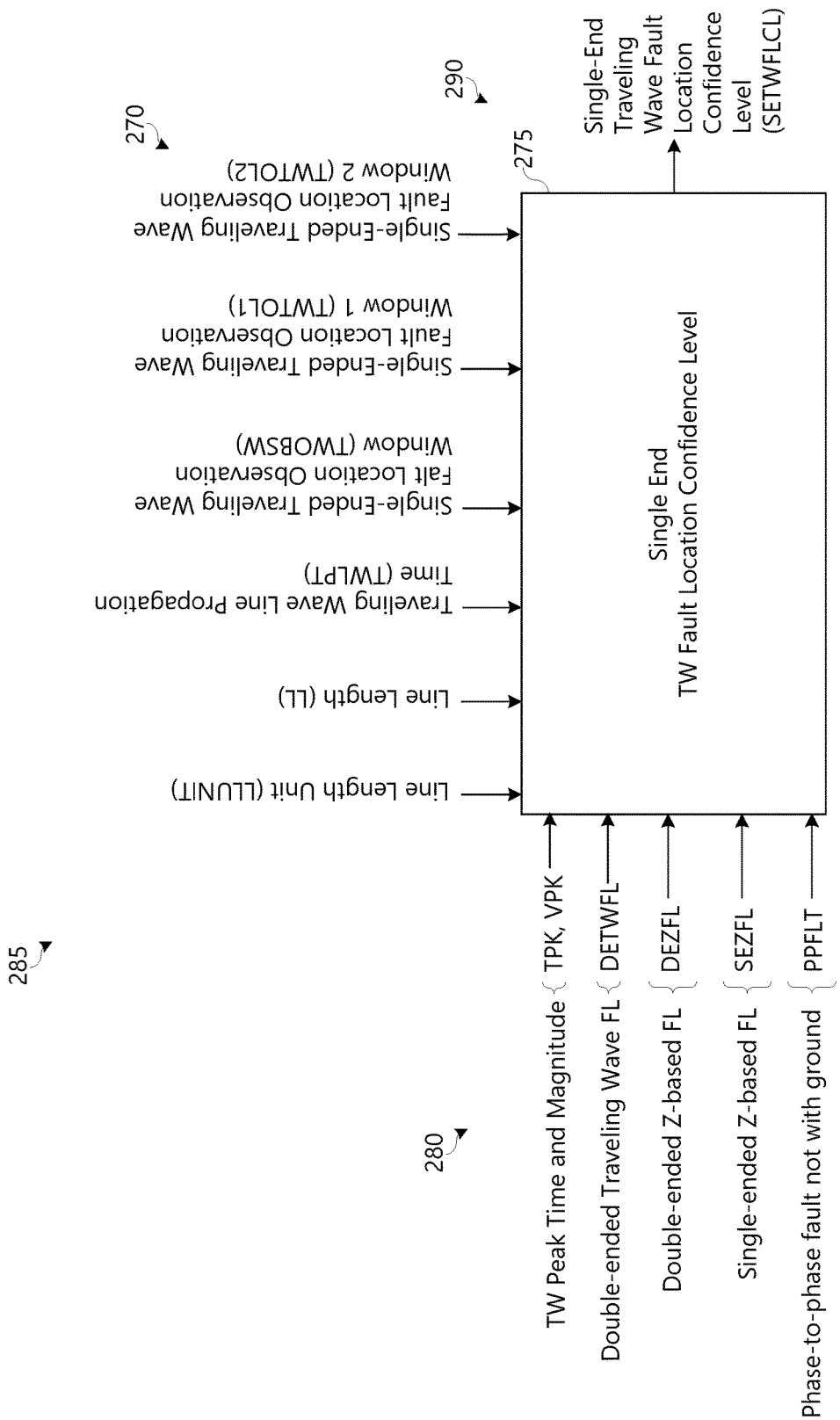
FIG. 2 illustrates a block diagram of the inputs, parameters, and outputs of a single-ended traveling wave fault location system, such as may be implemented by the IED in FIG. 7.

FIG. 2 illustrates a block diagram 285 of the inputs 280, parameters 270, and outputs 290 of a single end traveling wave fault location confidence level calculation block 275 in a traveling wave single ended fault location system. Inputs 280 may be obtained from measurements from the electric power delivery system (including inputs calculated from measurements obtained from the electric power delivery system) or received from other IEDs. Inputs 280 may include any combination of, for example: traveling wave peak times (TPKs) and magnitudes (VPKs) which may be calculated with the local IED in a traveling wave fault detector; a double-ended traveling wave fault location estimation (DETWFL), which may be received from another IED; a double-ended impedance-based fault location estimation (DEZFL), which may be received from another IED; a single-ended impedance-based fault location estimation (SEZFL), which may be calculated with the local IED using an impedance-based fault location calculation; and a phase-to-phase fault indicator (PPFLT), which may also include indication that the fault is not with ground, and which may be calculated with the local IED. The inputs of DETWFL, DEZFL, and SEZFL may be referenced to herein as independent fault location estimations. Any other fault location estimation that is calculated independent of single-ended traveling-wave fault locations may be an independent fault location estimation as described herein.

Parameters may include several parameters of the electric power delivery system such as, for example any combination of: line length units (LLUNIT), the line length (LL), the traveling wave line propagation time (TWLPT), a single-ended traveling wave fault location observation window (TWOBSW), another single-ended traveling wave fault location observation window 1 (TWOBSW1), and yet another single-ended traveling wave fault location observation window 2 (TWOBSW2). In some embodiments, some parameters may be user-input based on system conditions and some parameters may be dynamically calculated by the system instead of provided as an input. For example, the TWOBSW may be automatically set to 2.4, such that the observation window is equal to 2.4 times a TWLPT parameter. Similarly, the TWLPT parameter may be input as a parameter and/or may be automatically calculated based on an input LL and known system conditions/materials. Outputs 190 of the TWSEFL algorithm may include one or more traveling wave based single-end fault location estimations (TWSEFL1, TWSEFL2, TWSEFL3, and TWSEFL4). Alternatively, a single traveling wave single-ended fault location, TWSEFL, may be output based on the hypothesis determined to be most accurate.

Figure 3:
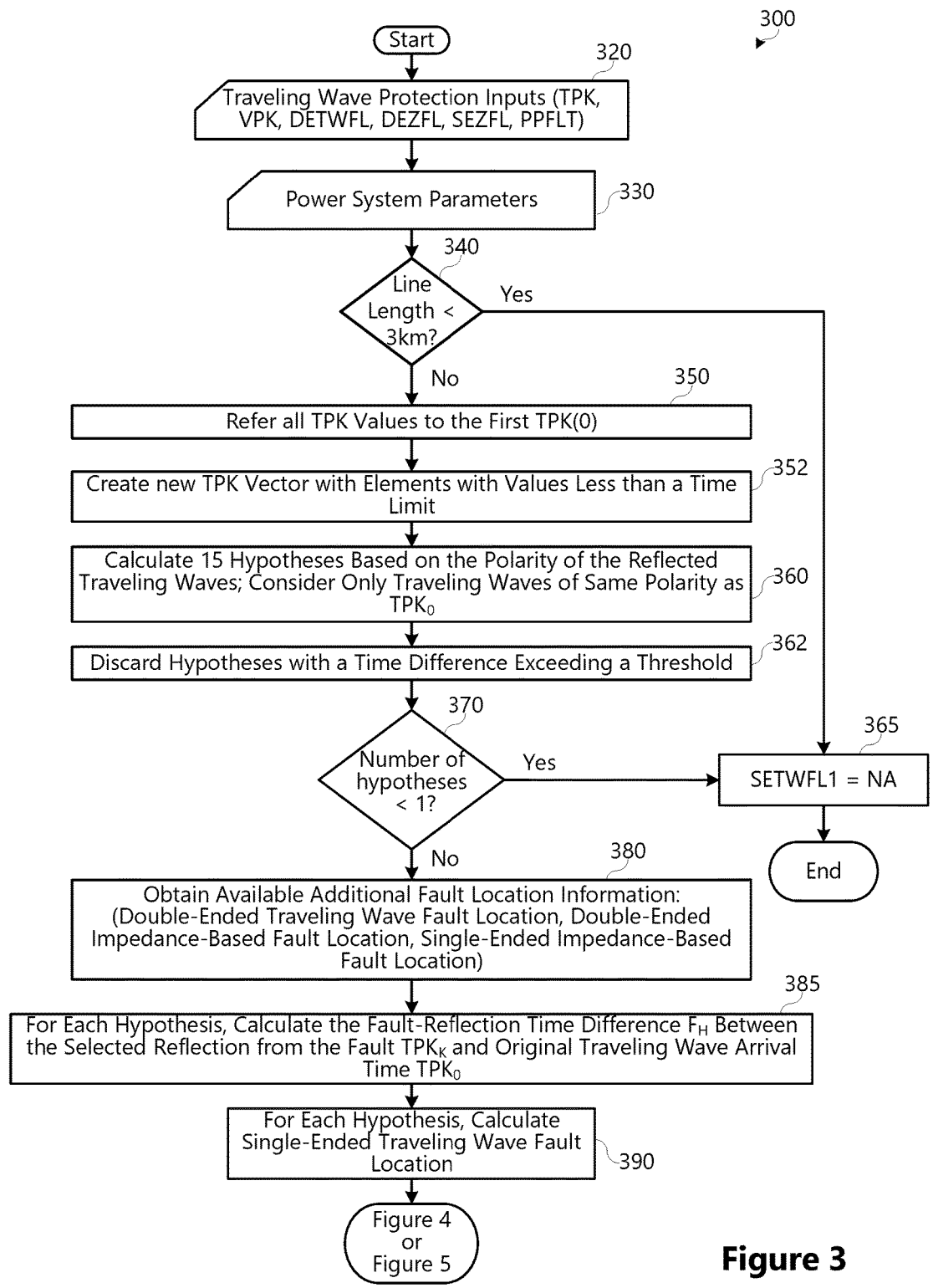
FIG. 3 illustrates a flowchart including inputs and parameters for performing operations of a method for calculating a fault location.

FIG. 3 illustrates a method for determining a fault location in accordance with several embodiments herein. The method 300 may receive inputs 320 and parameters 330 for performing operations of the method 300 to calculate a fault location. For example, a fault location system may implement the TWSEFL algorithm by identifying arrival times (TPKs) (i.e., time stamps) of traveling wave amplitude peaks (VPKs) of traveling waves that correspond to the mode that includes the maximum amplitude within an observation window defined by a function of the TWOBSW parameter and the TWLPT (e.g., TWOBSW*TWLPT). In one particular embodiment, the TWOBSW may be 2.4 such that the observation window is equal to 2.4 times the TWLPT.

If the line length (LL) is less than a threshold (such as, for example, 3 km) at 340, the then method sets the single-ended traveling wave fault location bit to indicate that no estimated single-ended traveling wave fault location may be generated at 365, and the method may end. In various implementations, an incident traveling wave may not be capable of differentiation from reflections when the line length is very short due to the short time between the time of arrival of the initial traveling wave and the time of arrival of the reflection.

A first TPK value corresponding to the first received VPK within the observation window can be used as a reference traveling wave $TPK_0$, and all other TPK values can be referenced, at 350, with respect to $TPK_0$, such that for each of the TPK values $TPK_0$ to TPKN, a referenced TPK value can be calculated as follows for each value of X for X=1 to N where N is the number of reflections as illustrated in Equation 4

$$TPK_{REF\_X} = TPK_X - TPK_0 \qquad \text{Eq. 4}$$

A new TPK vector (or set of TPK values) can be formed that includes the referenced TPK values below a threshold $t_{LIMIT}$ at 352. Input parameters 330 can be used to establish the threshold, $t_{LIMIT}$, as illustrated in Equation 5, for example:

$$t_{LIMIT} = \min(TWOBSW*TWLPT, 10000 \text{ μs}) \qquad \text{Eq. 5}$$

A set of hypotheses, $H_1$-$H_N$, may be generated based the values in the TPK vector corresponding to VPKs that have the same polarity as the VPK corresponding to $TPK_0$ at 360. In some embodiments, up to 15 hypotheses (or other arbitrary maximum number of hypotheses) may be initially considered as hypotheses for calculating the fault location. The system evaluates each of a plurality of hypothesis TPK values to determine if a hypothesis TPK value corresponds to the first VPK associated with a reflection from the fault. Hypotheses with a time difference exceeding a threshold may be discarded 362. For example, hypotheses that have a time difference relative to $TPK_0$ greater than 2*TWLPT+10 microseconds may be discarded. If no hypotheses exist, at 370, then no estimated single-ended traveling wave fault location may be generated, at 365, and the method may end.

Otherwise, if the number of hypotheses is one or greater at 370, then the method may continue to obtain available additional fault location information such as, for example, double-ended traveling wave fault location estimations, double-ended impedance-based fault location estimations, single-ended impedance-based fault location estimations, and the like at 380.

For each hypothesis at 385, the method may calculate the fault reflection time difference $F_H$ between the selected reflection from the fault $TPK_K$ and the original traveling wave arrival time $TPK_0$, calculated as a fault-reflection time difference; which corresponds to $TPK_{REF-X}$ above: $F_H = TPK_H$. For each hypothesis, at 390, the method may calculate the single-ended traveling-wave fault location $SETWFL_H$ using, for example, Equation 6:

$$SETWFL_H = LL * \left(\frac{F_H}{2*TWLPT}\right) \qquad \text{Eq. 6}$$

Figure 4:
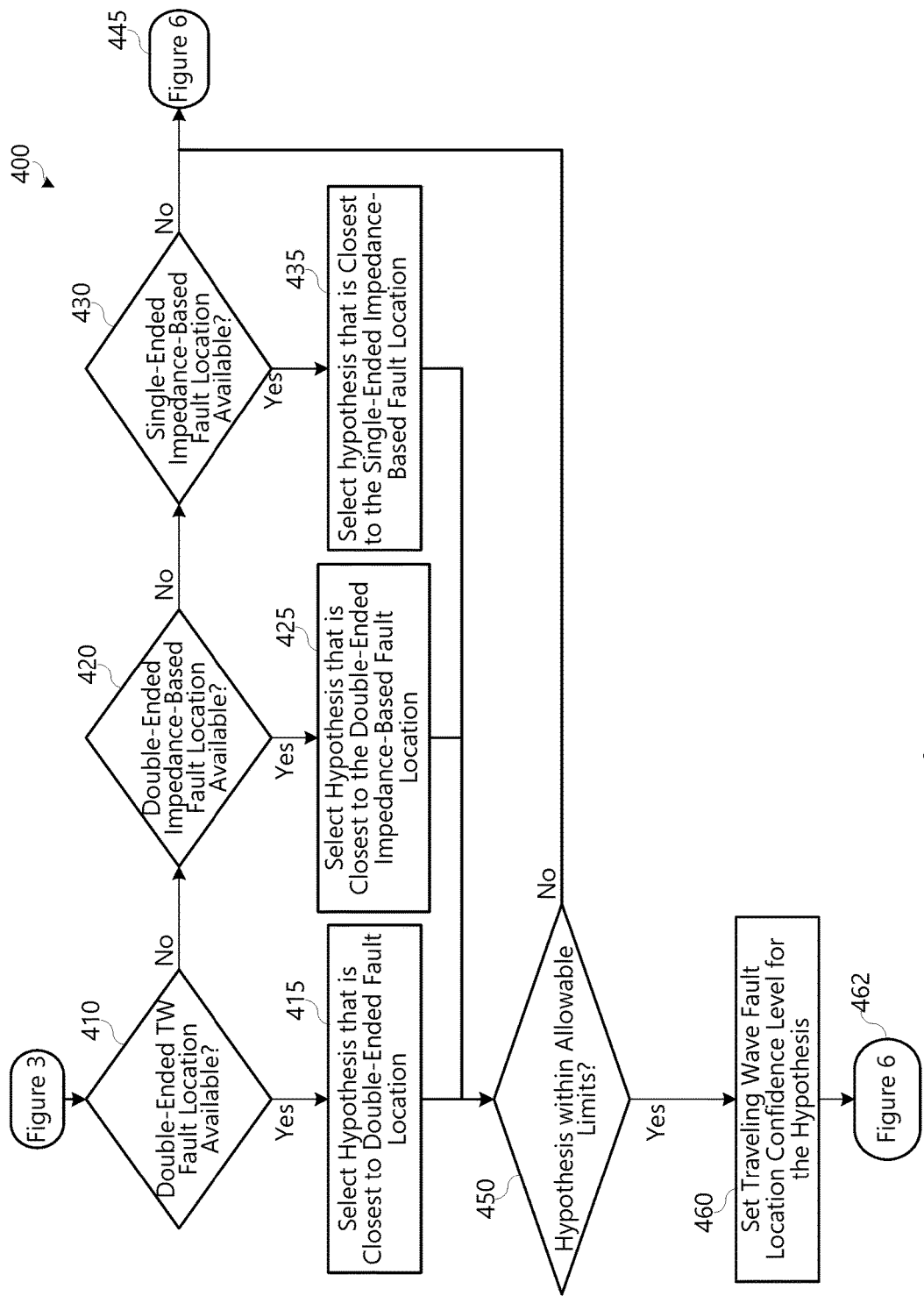
FIG. 4 illustrates a flowchart of an example of a method for determining the confidence level of a single-ended fault location calculation.
Figure 5:
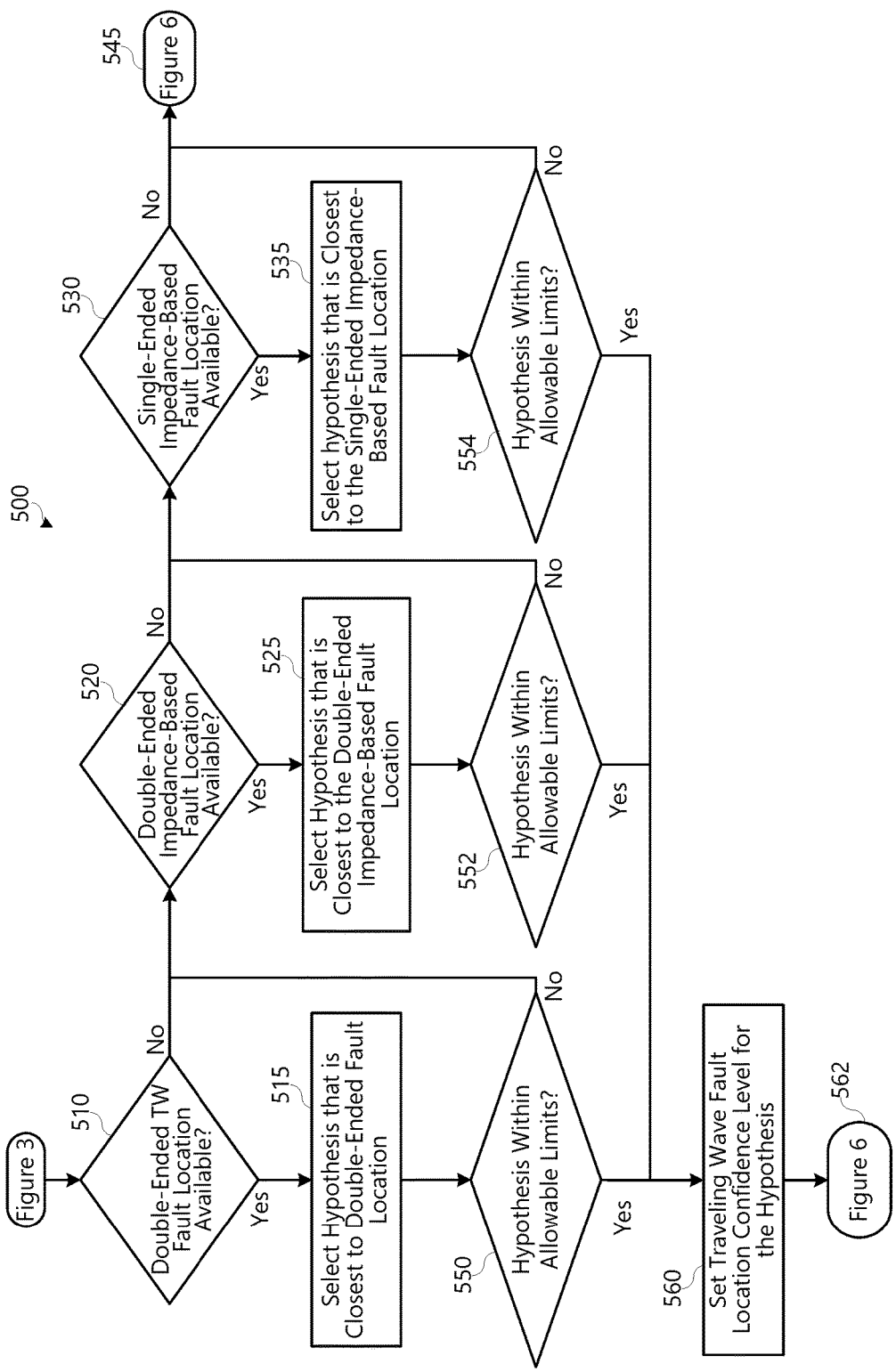
FIG. 5 illustrates a flowchart of an example of a method for determining the confidence level of a single-ended fault location calculation.

With an estimate for the single-ended fault location for each remaining hypothesis, the method continues in either FIG. 4 or FIG. 5, which illustrate two different options for determining a confidence level for the single-ended fault location estimates. In many implementations, certain fault location calculation techniques result in more accurate fault location calculations. For example, double-ended traveling wave fault location calculations may be more accurate than double-ended impedance-based fault location calculations, which are more accurate than single-ended impedance-based fault location calculations. Accordingly, FIGS. 4 and 5 are useful to set confidence levels of single-ended traveling-wave fault location calculations based first on available double-ended traveling-wave fault location calculations, followed by available double-ended impedance-based fault location information, and followed finally be single-ended impedance-based fault location information.

FIG. 4 illustrates a method 400 which first determines whether the double-ended traveling wave fault location estimation is available 410. If it is, then the method selects the hypothesis from the group of hypotheses that is closest to the double-ended fault location estimation at 415. If the double-ended traveling-wave fault location estimation is not available at 410, then the method proceeds to determine if the double-ended impedance-based fault location estimation is available at 420. If it is, then the method selects the hypothesis that is closest to the double-ended impedance-based fault location estimation at 425. If the double-ended impedance-based fault location estimation is not available at 420, then the method continues to determine whether the single-ended impedance-based fault location estimation is available at 430. If so, then the method continues to select the hypothesis that is closest to the single-ended impedance-based fault location at 435. If the single-ended impedance-based fault location estimation is not available at 430, then the method continues to FIG. 6 445, described in more detail below.

Once the hypothesis is selected in 415, 425, or 435, the method continues to determine whether the selected hypothesis is within allowable limits 450. If the hypothesis is not within allowable limits, the method continues to FIG. 6 445, described hereafter. If the hypothesis is within allowable limits, then the method sets a confidence level for the hypothesis in 460, and continues to FIG. 6 462.

Instead of using the method illustrated in FIG. 4, the improvements herein may follow the method flowing from FIG. 3 to the method illustrated in FIG. 5. The method 500 first determines whether the double-ended traveling wave fault location estimation is available 510. If it is, then the method selects the hypothesis from the group of hypotheses that is closest to the double-ended fault location estimation at 515, and determines whether the hypothesis is within allowable limits 550. If the hypothesis is within allowable limits, then the method sets the traveling wave fault location confidence level for the hypothesis 560, and continues to FIG. 6 562.

However, if the double ended traveling wave fault location estimate is not available at 510 or the hypothesis is not within the allowable limits 550, the method proceeds to determine if the double-ended impedance-based fault location estimation is available at 520. If it is, then the method selects the hypothesis that is closest to the double-ended impedance-based fault location estimation at 525 and determines whether the hypothesis is within allowable limits 552. If the hypothesis is within allowable limits, then the method sets the traveling wave fault location confidence level for the hypothesis 560, and continues to FIG. 6 562.

However, if the double-ended impedance-based fault location estimation is not available at 520 or if the hypothesis is not within allowable limits 552, then the method continues to determine whether the single-ended impedance-based fault location estimation is available at 530. If so, then the method continues to select the hypothesis that is closest to the single-ended impedance-based fault location at 535, and determines whether the hypothesis is within allowable limits 554. If the hypothesis is within allowable limits, then the method sets the traveling wave fault location confidence level for the hypothesis 560, and continues to FIG. 6 562.

Figure 6:
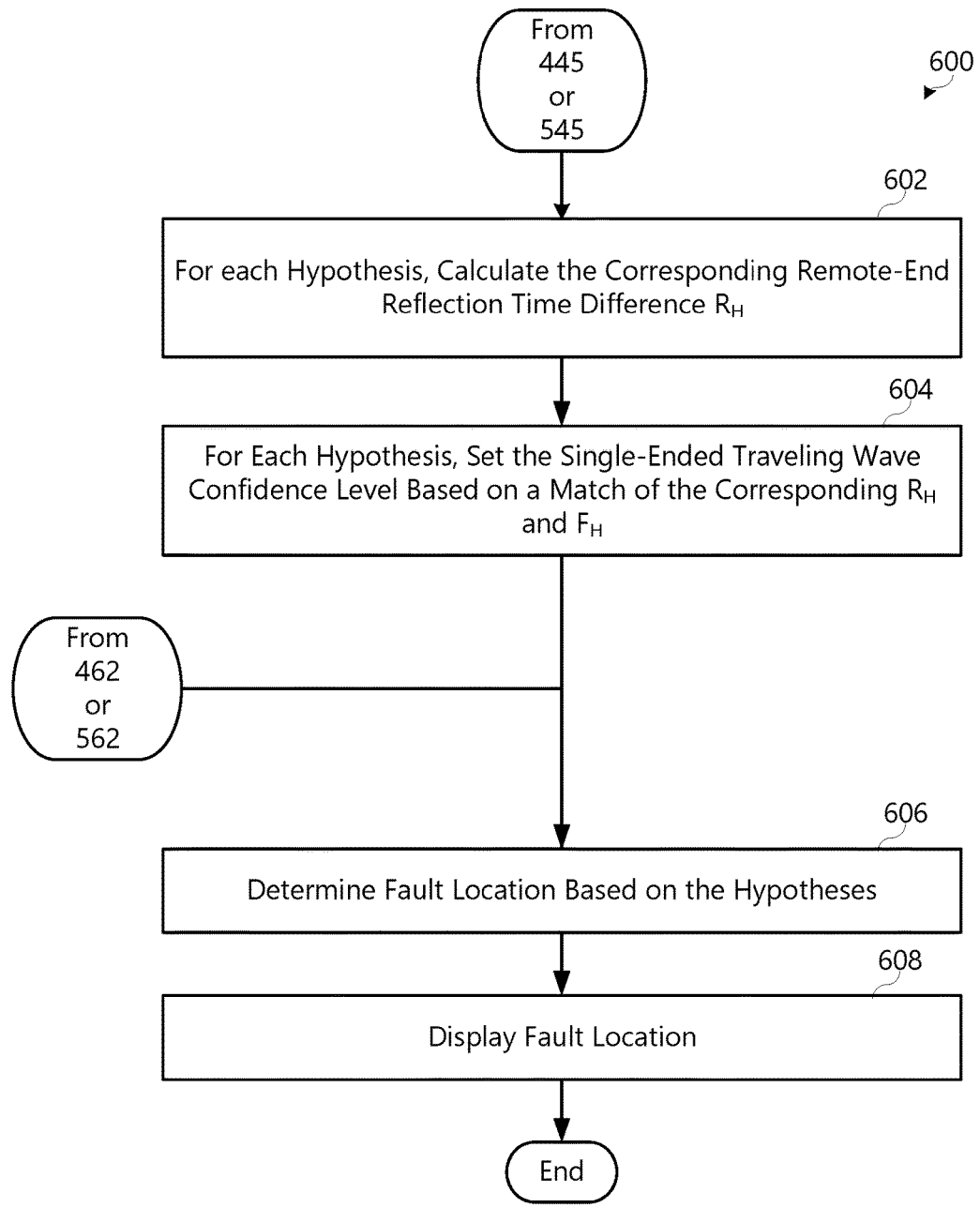
FIG. 6 illustrates a flowchart of portion of a method for determining the confidence level of a single-ended fault location calculation.

However, if the single-ended impedance-based fault location estimation is not available at 530 or if the hypothesis is not within allowable limits 554, then the method continues to FIG. 6 545.

A continuation of the method from step 445 of FIG. 4 or step 545 of FIG. 5 is found in the method 600 illustrated in FIG. 6. In certain embodiments, either the hypothesis of the selected single-ended traveling-wave fault location was not within allowable limits or none of the double-ended traveling-wave fault location estimation, the double-ended impedance-based fault location estimation, or the single-ended impedance-based fault location estimation are available. In this case, the method will calculate the remote-end reflection time difference $R_H$ for each hypothesis 602. The remote-end reflection time difference may be calculated to correspond with $2*(1-m)\cdot TWLPT$ as illustrated in Equation 7:

$$R_H = 2*TWLPT - F_H \qquad \text{Eq. 7}$$

Recall that for each hypothesis, the time difference between the selected reflection from the fault and $TPK_0$ has been calculated and used as a fault reflection time difference according to: $F_H = TPK_H$. Further, for each hypothesis, the method will set the single-ended traveling wave confidence level based on a match between the corresponding $R_H$ and $F_H$ 604. In one embodiment, the confidence level is set to 1 if there is one and only one match of $F_H$ and $R_H$ within the observation window in the measured TPK vector, and otherwise set the confidence level to 0. The observation window may be one of the parameters. The observation window may be 10 microseconds.

The method may continue to determine the fault location based on the hypothesis 606. The fault location may be used in several ways. As illustrated, the fault location may be displayed 608 or otherwise communicated such that a crew may be dispatched to investigate the fault and provide corrective actions. In other embodiments, the fault location may be used to effect a protective action such as tripping or opening a circuit breaker to remove electric power from the faulted portion of the electric power delivery system.

Following steps 462 or 562 from FIG. 4 or 5, the method may use the hypothesis and confidence levels therefrom to determine the fault location based on the hypothesis 606. In certain embodiments, the fault location may be determined only based on a hypothesis with a confidence level of 1, but not determined for a hypothesis with a confidence level of 0. Once again, the method may display the fault location or effect a protective action using the fault location 608.

Figure 7:
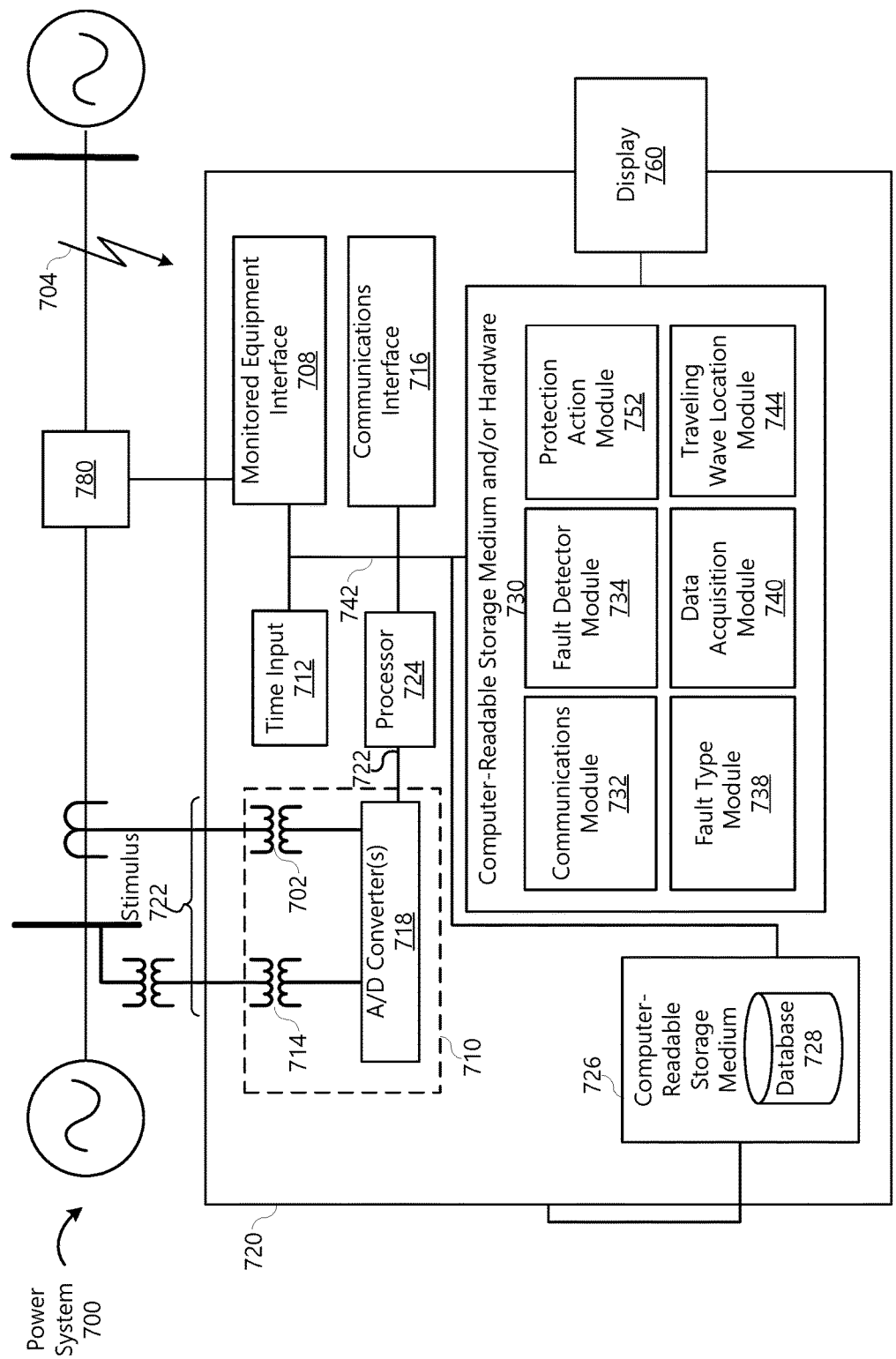
FIG. 7 illustrates an example of an intelligent electronic device (IED), according to several of the embodiments described herein.

FIG. 7 illustrates a simplified block diagram of a power system 700 that may be monitored by an IED 720 according to several of the embodiments described herein. The IED 720 includes a stimulus input 722 that may include a voltage input for receiving electric power system signals from a potential transformer or the like, and a current input for receiving electric power system signals from a current transformer or the like. The signals may be received by a signal processing module 710 that may include transformers 702, 714, A/D converter(s) 718, filters, and the like to produce electric power system signals useful for the processor 724 via bus 722. The IED 720 may include a time input 712 configured to receive a common time signal among a certain subset of IEDs and other devices. The common time signal may be a global navigation satellite system (GNSS) time signal, a terrestrial common time signal, a network time signal, or the like.

The IED 720 may include a monitored equipment interface 708 for communication with power system equipment. The monitored equipment interface 708 may be configured to interface with a circuit breaker 780, recloser, capacitor bank, voltage regulator, reactor, or the like for controlling operation of the equipment. The IED 720 may include a communications interface 716 for communication with other IEDs, or other devices. In one embodiment, IED 720 may be in communication with local equipment at a local location of the electric power system via the voltage and current inputs, while being in communication via the communication interface 716 with another IED at a remote location of the electric power delivery system. Thus, IED 720 may obtain electric power system conditions, operation information, and other communications related to a remote location of the electric power delivery system.

The IED 720 may include a computer-readable storage medium 726 for permanent and temporary storage of information. The computer-readable storage medium 726 may include a database 728, that may be a repository of settings, thresholds, and the like, useful for the operation of the IED 720. The IED 720 may further include a computer-readable storage medium 730 that includes several operating modules that when executed on the processor 724 cause the IED 720 to perform certain functions related to the monitoring and protection of the electric power delivery system. Each of the signal processing module 710, computer readable storage media 726, 730, time input 712, monitored equipment interface 708, communications interface 716, processor 724, and other modules may be in communication using a data bus 742.

The computer-readable storage medium 730 may include several modules operable on the processor 724. One such module may be a communication module 732 that includes instructions related to the transmission and receipt of communications. The communication module 732 may communicate fault locations to dispatch a line crew to investigate and/or repair the fault. The communication may be via a display, an HMI, a text message, an email message, another electronic message, via the SCADA system, or the like. The fault detector module 734 may include instructions related to detecting a fault 704 on the electric power delivery system using measurements obtained by the signal processing module 710 and/or from another IED via the communications interface 716. The fault type module 738 may be configured to determine a fault type (e.g. single-phase, multiple-phase, phase-to-phase, phase-to-ground, and the like) from available fault information. The data acquisition module 740 may include instructions related to treatment of the signals from signal processing 710 to produce data useful for other modules.

The traveling wave location module 744 may include instructions and/or electrical components to implement several of the systems, subsystems, and operations described herein. For example, traveling wave location module may be configured to locate a fault using traveling waves from a single end of the electric power delivery system. The traveling wave location module 744 may operate according to the several embodiments herein including calculating hypotheses and assigning a confidence level to the various hypotheses. The traveling wave location module 744 may use the hypotheses and the confidence levels in the calculation of the fault location estimation. The traveling wave location module 744 may be embodied within the computer-readable storage medium 730 and/or implemented as a stand-alone IED with subcomponents, modules, and inputs implemented in software, firmware, and/or hardware.

The protection action module 752 may include instructions for taking a protective action based on a detected fault 704 and fault location. For example, for a fault 704 within a selected zone of protection, the protection action module 752 may be configured to command a circuit breaker to open (via the monitored equipment interface 708) to clear a fault.

The IED 720 may include a display 760 (which may be an HMI, LEDs, LCD, touch-screen display, integrated into the IED 720, or separate from the IED 720) in communication with the computer-readable storage medium. The display 760 may receive and display information related to the occurrence of a fault, the calculated fault location(s), the confidence intervals, and the like. The display 760 may receive such information from the various software instructions of the computer-readable storage medium 730. The display 760 may be in communication with the processor 724.

A fault locator system may utilize a traveling wave single-end fault location (TWSEFL) algorithm to estimate a fault location using single-end traveling wave measurements and evaluations. The TWSEFL algorithm may use fault location estimations from the double-ended traveling-wave fault location (DETWFL) information and/or impedance-based fault location (ZFL) algorithms to determine a plurality of hypotheses based on detected traveling waves and reflections, and determine a confidence level for the hypotheses based on availability of double-ended traveling-wave based fault location estimates, double-ended impedance-based fault location estimates, single-ended impedance-based fault location estimates, and other factors. The fault locator system may display (using the display 760) the fault location estimations of all the above methods and use the confidence level to determine the order to display the fault location results. In one instance, the TWSEFL may have the highest priority when compared to all the above-mentioned methods if the confidence level is high and the lowest priority when the confidence level is low.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to determine a relative location of a fault in a power line of an electric power delivery system comprising:
- a traveling wave detector in electrical communication with the power line of the electric power delivery system to:
  - detect arrival time (TPK) and associated peak amplitude (VPK) of each of a plurality of traveling waves received at a first location on the power line; and,
  - identify hypothesis TPKs as TPKs corresponding to traveling waves detected after a first detected traveling wave that have the same polarity as the first detected traveling wave;
- a fault location determination subsystem comprising at least one processor and a memory to:
  - for each hypothesis TPK, calculate a fault reflection time difference $F_H$ between the hypothesis TPK and the time of the first detected traveling wave $TPK_0$;
  - for each hypothesis TPK, calculate a single-end traveling wave fault location using the fault reflection time difference $F_H$;
  - when an independent fault location estimation is available, select a hypothesis corresponding with a calculated single-end traveling wave fault location that is closest to the independent fault location estimation, and assign a confidence level to the hypothesis based on a difference between the independent fault location estimation and the calculated single-end traveling wave fault location within a threshold;
  - select one of the hypotheses based on the confidence level; and
  - calculate a location of the fault relative to the first location based on the length of the power line, a traveling wave line propagation time (TWLPT), and the selected hypothesis.

2. The system of claim 1, wherein the independent fault location estimation comprises a double-ended traveling-wave fault location estimation.

3. The system of claim 1, wherein the independent fault location estimation comprises a double-ended impedance-based fault location estimation.

4. The system of claim 1, wherein the independent fault location estimation comprises a single-ended impedance-based fault location estimation.

5. The system of claim 1, wherein the fault location determination subsystem is further to:
- use a double-ended traveling-wave fault location estimation as the independent fault location estimation when the double-ended traveling-wave fault location estimation is available;
- use a double-ended impedance-based fault location estimation as the independent fault location estimation when the double-ended traveling-wave fault location estimation is not available; and
- use a single-ended impedance-based fault location estimation as the independent fault location estimation when the double-ended traveling-wave fault location estimation is not available and the double-ended impedance-based fault location estimation is not available.

6. The system of claim 1, wherein when no independent fault location estimation is available, the fault location determination subsystem is configured to
- for each hypothesis, calculate a corresponding remote reflection time difference $R_H$ as a difference between twice a traveling wave line propagation time and the fault reflection time difference $F_H$ associated with the hypothesis;
- for each hypothesis, compare the remote reflection time difference $R_H$ and the fault reflection time difference $F_H$; and,
- assign a confidence level to a hypothesis for which a difference between the $R_H$ and the $F_H$ is within a predetermined threshold.

7. The system of claim 1, wherein if the line length is below a predetermined threshold, a single-end traveling wave fault location estimation is not determined.

8. The system of claim 1, wherein when a number of hypothesis is less than one, a single-end traveling wave fault location estimation is not determined.

9. The system of claim 1, further comprising a display to display the calculated location of the fault.

10. The system of claim 9, wherein the display further displays the confidence level related to the calculated location of the fault.

11. A method of calculating a relative location of a fault in a power line of an electric power delivery system comprising:
- detecting, via a detector in electrical communication with the power line of the electric power delivery system, an arrival time (TPK) and peak amplitude (VPK) of each of a plurality of traveling waves at a first location of the power line;
- identifying TPKs corresponding to VPKs detected after a first detected traveling wave that have the same polarity as the first detected traveling wave as hypotheses;
- for each hypothesis TPK, calculating a fault reflection time difference $F_H$ between the hypothesis TPK and the time of the first detected traveling wave $TPK_0$;
- for each hypothesis TPK, calculating a single-end traveling wave fault location using the fault reflection time difference $F_H$;
- when an independent fault location estimation is available, selecting a hypothesis corresponding with a calculated single-end traveling wave fault location that is closest to the independent fault location estimation, and assign a confidence level to the hypothesis based on a difference between the independent fault location estimation and the calculated single-end traveling wave fault location within a threshold;
- selecting one of the hypotheses based on the confidence level; and
- calculating a location of the fault relative to the first location based on the length of the power line, a traveling wave line propagation time (TWLPT), and the selected hypothesis.

12. The method of claim 11, wherein the independent fault location estimation comprises a double-ended traveling-wave fault location estimation.

13. The method of claim 11, wherein the independent fault location estimation comprises a double-ended impedance-based fault location estimation.

14. The method of claim 11, wherein the independent fault location estimation comprises a single-ended impedance-based fault location estimation.

15. The method of claim 11, further comprising:
- using a double-ended traveling-wave fault location estimation as the independent fault location estimation when the double-ended traveling-wave fault location estimation is available;
- using a double-ended impedance-based fault location estimation as the independent fault location estimation when the double-ended traveling-wave fault location estimation is not available; and using a single-ended impedance-based fault location estimation as the independent fault location estimation when the double-ended traveling-wave fault location estimation is not available and the double-ended impedance-based fault location estimation is not available.

16. The method of claim 11, further comprising:

when no independent fault location estimation is available, the method:

for each hypothesis, calculating a remote reflection time reference $R_H$ as a difference between twice a traveling wave line propagation time and the fault reflection time difference $F_H$ associated with the hypothesis;

for each hypothesis, comparing the $R_H$ and the $F_H$; and, assigning a confidence level to a hypothesis for which a difference between the $R_H$ and the $F_H$ is within a predetermined threshold.

17. The method of claim 11, wherein if the line length is below a predetermined threshold, a single-end traveling wave fault location estimation is not determined.

18. The method of claim 11, wherein when a number of hypothesis is less than one, a single-end traveling wave fault location estimation is not determined.

19. The method of claim 11, further comprising displaying the calculated location of the fault.

20. The method of claim 11, further comprising displaying the confidence level related to the calculated location of the fault.

* * * * *